(12) United States Patent
Shabra

(10) Patent No.: US 7,936,298 B2
(45) Date of Patent: May 3, 2011

(54) INTEGRATED CIRCUIT AND ELECTRONIC DEVICE COMPRISING THRESHOLD GENERATION CIRCUITRY AND METHOD THEREFOR

(75) Inventor: Ayman Shabra, Woburn, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/562,144

(22) Filed: Sep. 18, 2009

(65) Prior Publication Data

US 2011/0068846 A1    Mar. 24, 2011

(51) Int. Cl.
 *H03M 1/12*  (2006.01)
(52) U.S. Cl. ........ 341/155; 341/118; 341/120; 341/156; 341/158; 341/159
(58) Field of Classification Search .......... 341/118–121, 341/142, 144, 154, 155, 156, 158, 159
See application file for complete search history.

(56) References Cited

U.S. PATENT DOCUMENTS

| | | | | |
|---|---|---|---|---|
| 5,055,847 A * | 10/1991 | Rybicki et al. | ................ | 341/162 |
| 5,231,399 A * | 7/1993 | Gorman et al. | ................ | 341/159 |
| 5,589,831 A * | 12/1996 | Knee | ................ | 341/159 |
| 5,877,718 A * | 3/1999 | Andoh et al. | ................ | 341/155 |
| 5,990,814 A * | 11/1999 | Croman et al. | ................ | 341/118 |
| 6,255,979 B1 * | 7/2001 | Allee et al. | ................ | 341/159 |
| 6,437,724 B1 * | 8/2002 | Nagaraj | ................ | 341/159 |
| 6,833,800 B1 * | 12/2004 | Patterson | ................ | 341/134 |
| 7,394,420 B2 * | 7/2008 | Landolt | ................ | 341/158 |
| 7,760,126 B2 * | 7/2010 | Terranova | ................ | 341/159 |
| 2005/0093732 A1 * | 5/2005 | Clara et al. | ................ | 341/155 |
| 2007/0182615 A1 * | 8/2007 | Aliahmad et al. | ................ | 341/154 |
| 2008/0238746 A1 * | 10/2008 | Fayed et al. | ................ | 341/143 |
| 2009/0058527 A1 * | 3/2009 | Srinivasa et al. | ................ | 330/259 |

OTHER PUBLICATIONS

[Susana Paton], [A 70-mW 300-MHz CMOS Continuous ADC With 15-MHz Bandwidth and 11 Bits of Resolution], [IEEE], [Jul. 2004], [P1056-1063], [2004 JSSC paper].

* cited by examiner

*Primary Examiner* — Linh V Nguyen
(74) *Attorney, Agent, or Firm* — Winston Hsu; Scott Margo

(57) ABSTRACT

An integrated circuit comprises a threshold generation circuitry for generating at least one differential voltage signal. The threshold generation circuitry comprises at least one common mode current generation circuit arranged to generate at least one common mode current signal, whereby said at least one common mode current signal is combined with at least one input current signal to produce a combined current signal comprising a combined signal common mode component. Conversion circuitry is arranged to receive the combined current signal and convert the combined current signal into the at least one differential voltage signal for use within the comparator circuit. The threshold generation circuitry further comprises feedback circuitry arranged to receive an indication of the combined signal common mode component, compare the received indication to a reference value, and regulate the at least one common mode current signal based at least partly on the comparison results.

20 Claims, 5 Drawing Sheets

INTEGRATED CIRCUIT AND ELECTRONIC DEVICE COMPRISING THRESHOLD GENERATION CIRCUITRY AND METHOD THEREFOR

FIELD OF THE INVENTION

The field of the invention relates to an integrated circuit and an electronic device comprising threshold generation circuitry and a method therefor. The invention is particularly applicable to, but not limited to, threshold generation circuitry for use within analogue to digital converters.

BACKGROUND OF THE INVENTION

A flash Analogue to Digital Converter (ADC), also known as a direct conversion ADC, uses a linear voltage ladder with a comparator at each 'rung' of the ladder, in order to compare the input voltage to successive reference voltages that are provided by successive rungs of the voltage ladder. Typically the voltage ladder comprises a plurality of resistors that are connected in series; although it has been shown that capacitive voltage division is also possible.

A benefit of flash ADCs is that they are extremely fast compared to many other types of ADCs that typically use a multi-stage approach to fine tune to the 'correct' digital value. Furthermore, flash ADCs tend to be relatively simple to implement, and apart from the analogue comparators used in the ADC, they only require logic for final conversion from a digital signal to a binary value.

FIG. 1 illustrates an example of a conventional 2-bit flash ADC circuit 100. The converter circuit 100 comprises a voltage ladder 110 for providing threshold voltages. In particular for the illustrated example, the voltage ladder 110 is in a form of a resistor string comprising two resistors 112, 114 connected in series between a reference voltage 116 and ground 118, such that the reference voltage 116 is divided across the resistors 112, 114 to provide three threshold voltage values 120, 130, 140.

The converter circuitry 100 of FIG. 1 further comprises three comparators 122, 132, 142. Positive inputs of comparators 122, 132, 142 are connected to an input voltage 150, whilst negative inputs of comparators are connected to the threshold voltage values 120, 130, 140 respectively. In this manner, the first comparator 122 performs a comparison of the input voltage 150 to the first threshold voltage 120 and outputs an indication of whether the input voltage 150 is higher or lower than the first threshold voltage 120; the second comparator 132 performs a comparison of the input voltage 150 to the second threshold voltage 130 and outputs an indication of whether the input voltage 150 is higher or lower than the second threshold voltage 130; and the third comparator 142 performs a comparison of the input voltage 150 to the third threshold voltage 140 and outputs an indication of whether the input voltage 150 is higher or lower than the third threshold voltage 140. The outputs of the comparators 122, 132, 142 are operably coupled to binary conversion logic 160, which outputs a 2-bit value based on the indications received from the comparators 122, 132, 142.

In an integrated system, for example in a case where a flash ADC forms a part of an integrated circuit device, the supply and ground lines typically experience significant amounts of noise, which can greatly affect the performance accuracy of a circuit. In order to reduce the effect of such noise, it is desirable to use differential signals, which are more tolerant of noise present on the supply and ground lines.

FIG. 2 illustrates an example of a known 2-bit flash ADC circuit 200 adapted to support differential signals. In the same manner as for the converter circuit 100 of FIG. 1, the converter circuit 200 of FIG. 2 comprises a voltage ladder 210 for providing threshold voltages. In particular for the illustrated example, the voltage ladder 210 is in a form of a resistor string comprising two resistors 212, 214 connected in series between a reference voltage 216 and ground 218, such that the reference voltage 216 is divided across the resistors 212, 214 to provide three threshold voltage values 220, 230, 240.

The converter circuitry 200 of FIG. 2 further comprises three comparators 222, 232, 242 comprising differential input ports. A first differential input of each comparator 222, 232, 242 is connected to a differential input signal 250, whilst a second differential input of each comparator 222, 232, 242 is connected to two of the threshold voltage values 220, 230, 240 as follows to provide differential threshold signals. The second differential input of the first comparator 222 is connected to the first threshold voltage 220 (as a positive differential input signal) and the third threshold voltage 240 (as a negative differential input signal). In this manner, the first comparator 222 performs a comparison of the differential input signal 250 to a differential threshold signal provided by the first and third threshold voltages 220, 240, and outputs an indication of whether the differential input signal 250 is higher or lower than the differential threshold signal provided by the first and third threshold voltages 220, 240. The second threshold voltage 230 provides both the positive and negative differential input signals for the second differential input of the second comparator 232. In this manner, the second comparator 232 performs a comparison of the differential input signal 250 to a differential threshold signal provided by the second threshold voltage 230 (which in this case will be a common voltage signal), and outputs an indication of whether the differential input signal 250 is higher or lower than the differential threshold signal provided by the second threshold voltage (i.e. effectively indicating whether the differential input signal 250 is positive or negative in this case). The second differential input of the third comparator 242 is connected to the third threshold voltage 240 (as a positive differential input signal) and the first threshold voltage 220 (as a negative differential input signal). In this manner, the third comparator 242 performs a comparison of the differential input signal 250 to a differential threshold signal provided by the third and first threshold voltages 240, 220, and outputs an indication of whether the differential input signal 250 is higher or lower than the differential threshold signal provided by the third and first threshold voltages 240, 220. The outputs of the comparators 222, 232, 242 are operably coupled to binary conversion logic 260, which outputs a 2-bit value based on the indications received from the comparators 222, 232, 242.

A problem with this known differential solution is that it results in suboptimal comparator design, due to the use of at least two differential pairs. Each differential pair contributes to the comparator offset, thereby resulting in a net increase in offset voltage. In addition, such design either exhibits limited linearity performance, which subsequently requires the use of degeneration, which in turn results in an increase in offset voltage, or the design exhibits sensitivity to differences in the common mode voltage of the input and the reference.

FIG. 3 illustrates a simplified example of an ADC circuit 300 proposed in a paper entitled "A 70-mW 300-MHz CMOS continuous-time ΣΔ ADC with 15-MHz bandwidth and 11 bits of resolution" by Paton et al, published in the IEEE Journal of Solid-State Circuits, July 2004. Here, an input signal is first converted to a current. For the illustrated example, the input signal comprises analogue differential input voltage signals 305, which are converted to differential current signals by way of transconductor 310. The differential current signals output by the transconductor 310 are provided to a differential voltage ladder 320, which comprises a pair of resistor strings 340, 350 for converting received current signals into voltage signals 342, 344, 346, 352, 354, 356 that are provided to inputs of comparators 362, 364, 366. In addition to the differential currents resulting from the input signals 305, the transconductor 310 produces a common mode current, which also flows through the resistors. An additional common mode current component is provided to each of the resistor strings 340, 350 by transistors 330, 335. The combination of these common mode currents creates a DC voltage drop across each of the resistors in the voltage ladder 320. These DC voltage drops appear in the voltage signals 342, 344, 346, 352, 354, 356 provided to the inputs of the comparators 362, 364, 366, and represent the necessary thresholds for the comparators. Using the superposition principal, the signals received by the inputs of the comparators 362, 364, 366 comprise the combination of the differential input signals and the threshold voltages.

An advantage provided by the arrangement of FIG. 3 is that by combining the input signal and the thresholds before they are applied to the comparators, zero threshold comparators may be used. These zero threshold comparators are more robust and power efficient compared to comparators that process the input signal and thresholds separately, such as those used in the arrangements of FIGS. 1 and 2.

However, a problem with the arrangement of FIG. 3 is that the threshold voltages with which the input signal is combined are susceptible to changes in supply voltages, bias current changes, temperature changes, manufacturing process changes, device mismatches in the transconductance (or D/A converter for digital inputs), etc. As a result, the threshold voltages are susceptible to variations that cause changes to the flash transfer characteristics, i.e. the relation between the input and the output. Such a change in flash transfer characteristics effectively results in a gain change. In applications where the flash converter is used as part of a feedback loop, for example within a Sigma Delta converter, this variation changes the loop gain and can therefore cause degradation in performance or even lead to instability. Such a gain variation can also cause distortion, for example in pipeline or cyclic converters. This is due to the fact that the thresholds are no longer where they should ideally be, and this can result in a low gain state or even saturation in the residue amplifier.

Thus, a need exists for an improved integrated circuit comprising threshold generation circuitry, an analogue-to-digital converter circuit, and a method therefor that may alleviate one or more of the aforementioned problems of known threshold or ADC circuits.

SUMMARY OF THE INVENTION

Accordingly, the invention seeks to mitigate, alleviate or eliminate one or more of the above mentioned disadvantages singly or in any combination. Aspects of the invention provide an integrated circuit comprising a threshold generation circuitry, an analogue-to-digital converter and a method therefor as described in the appended claims.

According to a first aspect, there is provided an integrated circuit comprising threshold generation circuitry for generating at least one differential voltage signal for use within a comparator circuit. The threshold generation circuitry comprises at least one common mode current generation circuit arranged to generate at least one common mode current signal comprising a common mode component, whereby the at least one common mode current signal is combined with at least one input current signal comprising a differential input component in order to produce a combined current signal comprising a combined signal common mode component and a combined signal differential component. The threshold generation circuitry further comprises conversion circuitry arranged to receive the combined current signal and to convert the combined current signal into the at least one differential voltage signal for use within the comparator circuit. The threshold generation circuitry further comprises feedback circuitry arranged to receive an indication of the combined signal common mode component, compare the received indication of the combined signal common mode component to a reference value, and regulate the at least one common mode current signal generated by the at least one common mode current generation circuit based at least partly on the comparison of the received indication of the combined signal common mode component to the reference value.

Thus, in one example, the common mode component of the combined current signal, from which the threshold signal component(s) of the at least one differential voltage signal for use within the comparator circuit is(/are) derived, may be regulated to take into account, say, changes in supply voltages, bias current changes, temperature changes, manufacturing process changes, device mismatches in the transconductance (or D/A converter for digital inputs), etc. Accordingly, a desired common mode component may be substantially assured within the combined current signal, irrespective of detrimental influences such as those outlined above. As a result, reliable threshold voltages may be provided within the differential voltage signals to be used within the comparator circuit, which enables consistent and reliable flash transfer characteristics to be provided for, say, a flash ADC in which the threshold generation circuitry is implemented, e.g. the relation between the input and the output of the flash ADC, thereby maintaining a consistent gain etc. Furthermore, in applications where the flash converter is used as part of a feedback loop, for example within a Sigma Delta converter, degradation in performance, instability, distortion, etc resulting from changes in the loop gain with the prior art solution may be substantially avoided.

According to an optional example, the combined current signal may comprise a pair of differential signals each comprising a differential component and a common mode component, and the indication of the combined signal common mode component may be provided by merging the differential signals into a single common mode signal. Furthermore, the single common mode combined current signal may be arranged to flow through a common resistance in order to create a voltage signal to provide the indication of the combined signal common mode component. For example, the feedback circuitry may comprise an amplifier, and the voltage signal created by the single common mode combined current signal flowing through the common resistance may be provided to the amplifier as the indication of the common mode component of the combined current signal. The amplifier may be further arranged to receive a reference voltage, and to compare the voltage signal created by the single common mode combined current signal flowing through the common resistance to the reference voltage, and to output a result of the comparison in the form of a common mode current regulation signal.

According to an optional example, the common resistance may comprise a resistor string comprising n resistors of value R. The conversion circuitry may comprise a differential voltage ladder structure comprising a pair of resistor strings arranged to convert the received combined current signal into voltage signals for providing the at least one differential voltage signal for use within a comparator circuit, each resistor string of the ladder structure comprising x resistors of value R/x, and the threshold generation circuitry may be arranged to provide a threshold step within the at least one differential voltage signal for use within a comparator circuit equal to:

$$\frac{REF}{nR} \times \frac{1}{2} \times \frac{2 \times R}{x} = \frac{REF}{nx}. \quad [1]$$

According to an optional example, the feedback circuitry may comprise an amplifier arranged to receive the indication of the combined signal common mode component in a form of a voltage signal, and to compare the received voltage signal to a reference voltage. For example, the indication of the combined signal common mode component may be received in a form of a voltage signal provided by way of an input of the amplifier being operably coupled to input nodes of the conversion circuit, where the combined current is provided to the conversion circuit via resistors.

According to an optional example, the common mode current generation circuitry may comprise a pair of transistors arranged to provide the common mode current signal from drain terminals thereof. Furthermore, gate terminals of the transistors of the common mode current generation circuitry may be operably coupled together to provide a common gate terminal node, via which the common mode current signal provided by the transistors may be regulated.

According to an optional example, the threshold generation circuitry may further comprise at least one transconductance circuit arranged to receive as an input a differential input voltage signal and to convert the differential input voltage signal into the at least one input current signal.

According to an optional example, the threshold generation circuitry may further comprise at least one digital to analogue convert circuit arranged to receive as an input a digital input signal and to convert the digital input signal into the at least one input current signal.

According to an optional example, the conversion circuitry may comprise a differential voltage ladder structure comprising a pair of resistor strings arranged to convert the received combined current signal into voltage signals for providing the at least one differential voltage signal for use within a comparator circuit. For example, a voltage signal generated by a first resistor string may be paired with an inverse equivalent voltage signal generated by a second resistor string to generate a differential voltage signal for use within a comparator circuit.

According to an optional example, the threshold generation circuitry may be arranged to generate at least one differential voltage signal for use within comparator circuitry of a flash analogue to digital converter.

According to an optional example, the integrated circuit may be in a form of an analogue to digital converter integrated circuit.

According to an optional example, the analogue to digital converter may comprise a flash analogue to digital converter.

According to a second aspect of the invention, there is provided an electronic device comprising threshold generation circuitry for generating at least one differential voltage signal for use within a comparator circuit. The circuitry comprises common mode current generation circuitry arranged to generate a common mode current signal, whereby said common mode current signal is combined with at least one input current signal to produce a combined current signal comprising a combined signal common mode component, and conversion circuitry arranged to receive the combined current signal and to convert the combined current signal into the at least one differential voltage signal for use within the comparator circuit. The threshold generation circuitry further comprises feedback circuitry arranged to receive an indication of the combined signal common mode component, compare the received indication of the combined signal common mode component to a reference value, and regulate the at least one common mode current signal based at least partly on the comparison of the received indication of the combined signal common mode component to the reference value.

According to a third aspect of the invention, there is provided a method for generating at least one differential voltage signal for use within a comparator circuit. The method comprises combining at least one common mode current signal with at least one input current signal to produce a combined current signal. The combined current signal, thus, comprises a combined signal common mode component and a combined signal component. The method further comprises converting the combined current signal into the at least one differential voltage signal for use within the comparator circuit. The method further comprises comparing an indication of the combined signal common mode component to a reference value, and regulating the at least one common mode current signal based at least partly on the comparison of the indication of the combined signal common mode component to the reference value.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a flash Analogue to Digital Converter (ADC), also known as a direct conversion ADC. However, it will be appreciated by a skilled artisan that the inventive concept herein described may be embodied in any type of circuitry in which a differential voltage signal comprising a differential signal component and a threshold signal component is required to be generated for use within a comparator circuit. In a number of applications, the adaptation of threshold generation circuitry for generating at least one differential voltage signal for use within a comparator circuit in accordance with the examples of the invention effectively performs combining at least one common mode current signal comprising a first common mode current component with at least one input current signal comprising a differential input component in order to produce a combined current signal comprising a combined signal common mode component and a combined signal differential component, and converting the combined current signal into the at least one differential voltage signal for use within the comparator circuit. The threshold generation circuitry further effectively performs receiving an indication of the combined signal common mode component, comparing the received indication of the combined signal common mode component to a reference value, and regulating the at least one common mode current signal based at least partly on the comparison of the received indication of the combined signal common mode component to the reference value.

In this manner, the common mode component of the combined current signal, from which the threshold signal component(s) of the at least one differential voltage signal for use within the comparator circuit is(/are) derived, may be regulated to take into account, say, changes in supply voltages, bias current changes, temperature changes, manufacturing process changes, device mismatches in the transconductance (or D/A converter for digital inputs), etc. Accordingly, a desired common mode component may be substantially assured within the combined current signal, irrespective of detrimental influences such as those outlined above. As a result, reliable threshold voltages may be provided within the differential voltage signals to be used within the comparator circuit, which enables consistent and reliable flash transfer characteristics to be provided for, say, a flash ADC in which the threshold generation circuitry is implemented, i.e. the relation between the input and the output of the flash ADC, thereby maintaining a consistent gain etc.

Furthermore, in applications where the flash converter is used as part of a feedback loop, for example within a Sigma Delta converter, degradation in performance, instability, distortion, etc resulting from changes in the loop gain with the prior art solution may be substantially avoided.

Figure 4:
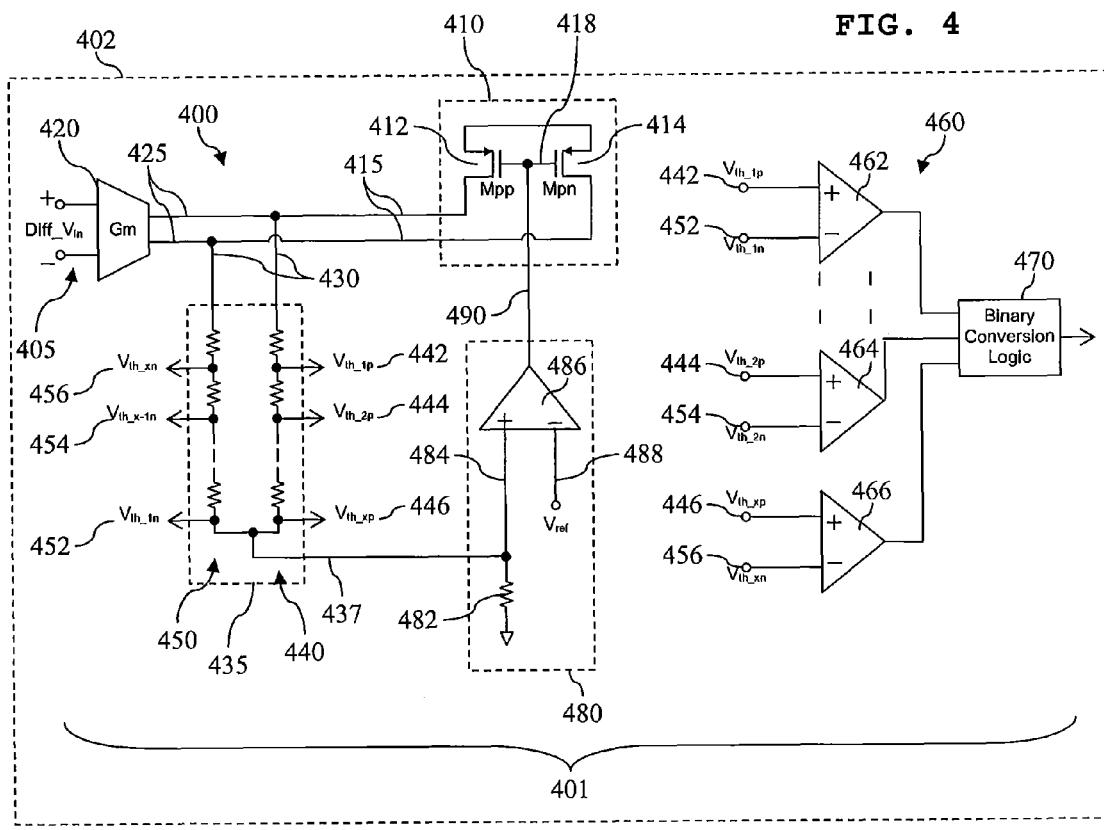
FIG. 4 illustrates an example of threshold generation circuitry.

Referring now to FIG. 4 there is illustrated an example of threshold generation circuitry 400. For the illustrated example, the threshold generation circuitry 400 forms a part of an analogue to digital converter (ADC) 401, and more specifically for the illustrated example a flash ADC. A benefit of flash converters is that they are extremely fast compared to many other types of ADCs that typically use a multi-stage approach to successively approach the 'correct' digital value. Furthermore, flash converters tend to be relatively simple to implement, and apart from the analogue comparators, only require logic for final conversion to binary. It is contemplated that the threshold generation circuitry 400 may be provided within an integrated circuit 402.

The threshold generation circuitry 400 comprises common mode current generation circuitry 410 arranged to generate a common mode current signal comprising a common mode component. In an integrated system, for example in a case where a flash ADC 401 forms a part of an integrated circuit 402, supply and ground lines may experience significant amounts of noise, which can greatly affect the performance of a circuit. In order to reduce the effect of such noise, it is desirable to use differential signals, which are more tolerant of noise present on the supply and ground lines. Accordingly, for the illustrated example the common mode current genera- tion circuitry 410 comprises a pair of transistors 412, 414 arranged to provide a common mode current signal 415 from drain terminals thereof. The common mode current signal 415 provided by the transistors 412, 414 may be regulated by way of gate terminals thereof, which for the illustrated example are operably coupled together to provide a common gate terminal node 418.

The common mode current signal 415 is combined with an input current signal 425 to produce a combined current signal 430. Accordingly, the input signal and the common mode signal are combined (summed) in the current domain. For the illustrated example, the input current signal 425 is provided by transconductance circuitry 420, which is arranged to receive as an input a differential input voltage signal 405 and to convert the differential input voltage signal 405 into the input current signal 425 comprising a differential input component. In addition to the differential input component, the input current signal 425 may further comprise a common mode component produced by the transconductance circuitry 420. Accordingly, the combined current signal 430 may comprise a differential component from the input current signal 425, and a combined common mode component comprising a first common mode component from the common mode current signal 415 and a further common mode component from the input current signal 425.

The threshold generation circuitry 400 further comprises conversion circuitry 435 arranged to receive the combined current signal 430 and to convert the combined current signal into the at least one differential voltage signal for use within a comparator circuit. For the illustrated example, the conversion circuitry 435 comprises a differential voltage ladder structure comprising a pair of resistor strings 440, 450 arranged to convert the received combined current signal 430 into voltage signals 442, 444, 446, 452, 454, 456 that may be used to provide one or more differential voltage signals for use within a comparator circuit, such as comparator circuit 460.

For the illustrated example, the comparator circuit 460 comprises comparators 462, 464, 466, each arranged to receive a differential voltage signal provided by the conversion circuitry 435. Specifically, the first comparator 462 is arranged to receive, as a positive differential component, the 'uppermost' voltage signal 442 from the first resistor string 440, and, as a negative differential component, the 'lowermost' voltage signal 452 from the second resistor string 450. The second comparator 464 is arranged to receive, as a positive differential component, the second uppermost voltage signal 444 from the first resistor string 440, and, as a negative differential component, the second uppermost voltage signal 454 from the second resistor string 450. The last comparator 466 is arranged to receive, as a positive differential component, the lowermost voltage signal 446 from the first resistor string 440, and, as a negative differential component, the uppermost voltage signal 456 from the second resistor string 450.

In this manner, each voltage signal generated by the first resistor string 440 is paired with the inverse equivalent voltage signal generated by the second resistor string 450 (for example as may be graphically represented as being diagonally opposing) to generate a differential voltage signal for comparison by a comparator 462, 464, 466. As will be appreciated, in a case where the comparator circuit 460 comprises three comparators, and each of the resistor strings 440, 450 is arranged to provide three voltage signals, the second uppermost voltage signal 454 from the second resistor string 450 received by the second comparator 464 as its negative differential component would be the same signal as the second uppermost voltage signal 454 from the second resistor string 450.

Although this example illustrates three comparators and two resistor strings, it is envisaged that other examples may employ any number of comparators and/or resistor strings, for example based on the application.

Each of the comparators 462, 464, 466 is arranged to perform a comparison of the differential voltage signals received thereby, and to output an indication of the result of the comparison, as is known in the art. The outputs of the comparators 462, 464, 466 are provided to binary conversion logic 470, which receives the indications output by the comparators 462, 464, 466, which outputs a binary value based on the received indications.

Figure 1:
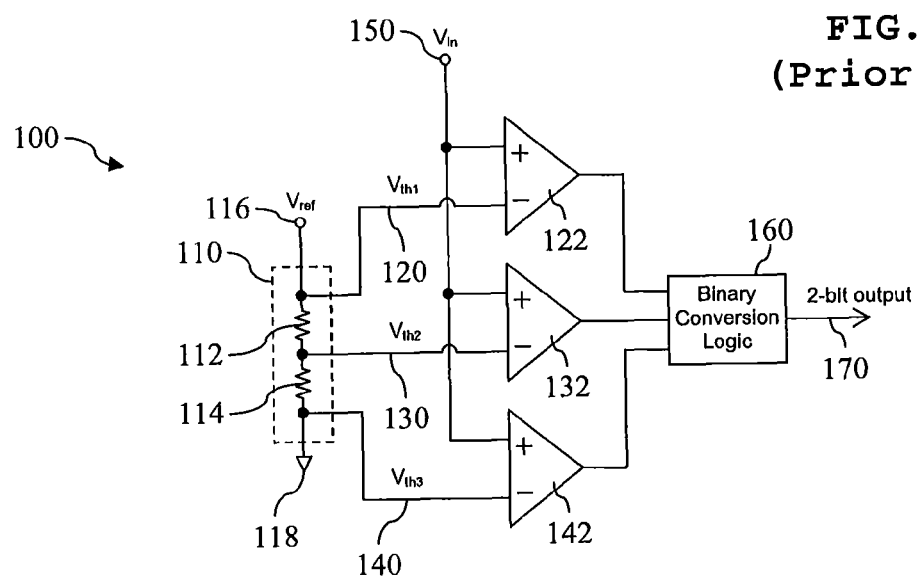
FIG. 1 illustrates an example of a conventional analogue to digital converter (ADC) circuit.
Figure 2:
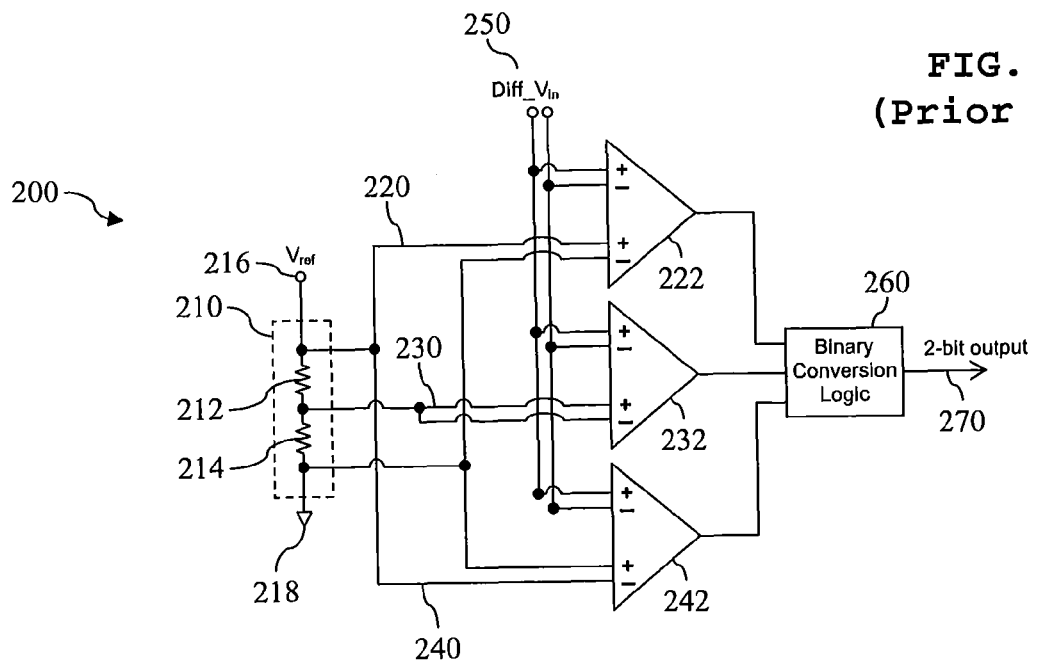
FIG. 2 illustrates an alternative example of a known ADC.
Figure 3:
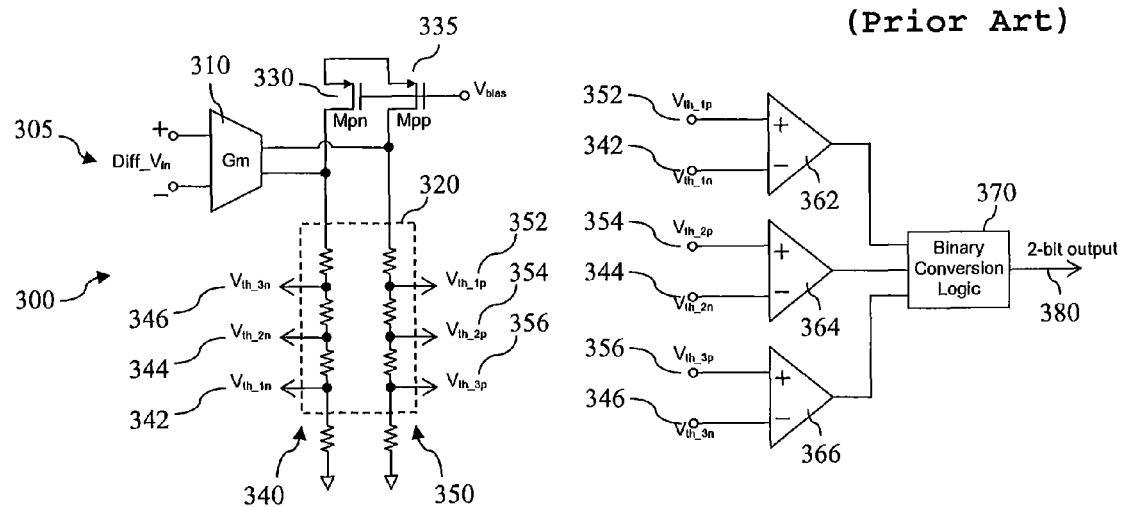
FIG. 3 illustrates a further alternative example of a known ADC.

As previously mentioned, the combined current signal 430 comprises a differential component from the input current signal 425, and common mode component comprising the first common component from the common mode current signal 415, and a possible further common mode component from the input current signal 425. The common mode components within the combined current signal 430 create a DC voltage drop across each of the resistors in the voltage ladder 435. These DC voltage drops appear in the voltage signals 442, 444, 446, 452, 454, 456 provided to the comparators 462, 464, 466, and represent thresholds for the comparators. Using the superposition principal, the signals received by the comparators 462, 464, 466 comprise the combination of the differential input signal and these threshold voltages. By combining the input signal and the thresholds before they are applied to the comparators in this manner, zero threshold comparators may be used, which are, advantageously more robust and power efficient compared to comparators that process the input and thresholds separately, such as the comparators used in the prior art arrangements of FIGS. 1 and 2.

In accordance with some examples, the threshold generation circuitry 400 further comprises feedback circuitry 480 arranged to receive an indication of the common mode component of the combined current signal 430, compare the received indication to a reference value, and to regulate the common mode current signal 415 generated by the common current generation circuitry 410 based at least partly on the comparison of the received indication of the combined signal common mode component to the reference value. Although other factors may influence the regulation of the common mode current (e.g. a maximum/minimum current value, more complicated 'ramping' implementations, etc.), it is envisaged that such factors may provide poorer results. In this example, the DC component in the combined current signal 430 is monitored and compared to the reference value (which is also a DC value), and a simple comparison can be made.

For example, the combined current signal 430, which as previously mentioned comprises a differential signal comprising a differential component and a common mode component, is merged into a single common mode signal. By merging the differential combined current signal to create a single common mode signal in this manner, the differential component within the differential combined current signal effectively sums to zero, leaving only the common mode component remaining within the single common mode signal. The resulting single common mode combined current signal may then be converted into a voltage signal to provide an indication of the common mode component of the combined current signal 430.

More specifically for the illustrated example, the resistor strings 440, 450 are operably coupled to ground via a common resistor 482 such that the combined current signal 430 flows through the resistor strings 440, 450, before being merged into a combined common mode current signal 437. The resulting combined common mode current signal 437 then flows through the common resistor 482 to ground such that a potential difference is created across the common resistor 482 that is substantially proportional to the common mode component of the combined current signal 430. This potential difference across the common resistor 482 creates a voltage signal 484 that is provided to an amplifier 486 as an indication of the common mode component of the combined current signal 430. A reference voltage 488 is also provided to the amplifier 486, which compares the voltage signal 484 to the reference voltage 488 and outputs a result of the comparison in a form of a common mode current regulation signal 490. This common mode current regulation signal 490 is then provided to the common gate terminal node 418 of the common mode current generation circuitry 410.

In this manner, the feedback circuitry 480 is able to regulate the common mode current signal 415 generated by the common mode current generation circuitry 410 based on the comparison of the received indication of the combined signal common mode component to the reference value, and thereby the common mode component of the combined current signal 430, from which the threshold signal components of the differential voltage signals for use within the comparator circuit 460 are derived. Thus, these may be regulated to take into account, say, changes in supply voltages, bias current changes, temperature changes, manufacturing process changes, device mismatches in the transconductance (or D/A converter for digital inputs), etc. Accordingly, a desired common mode component may be substantially assured within the combined current signal, irrespective of detrimental influences, such as those outlined above. As a result, reliable threshold voltages may be provided within the differential voltage signals to be used within the comparator circuit, which enables consistent and reliable flash transfer characteristics to be provided for the flash ADC 401 in which the threshold generation circuitry is implemented, i.e. the relation between the input and the output of the flash ADC, thereby maintaining a consistent gain, etc.

Figure 5:
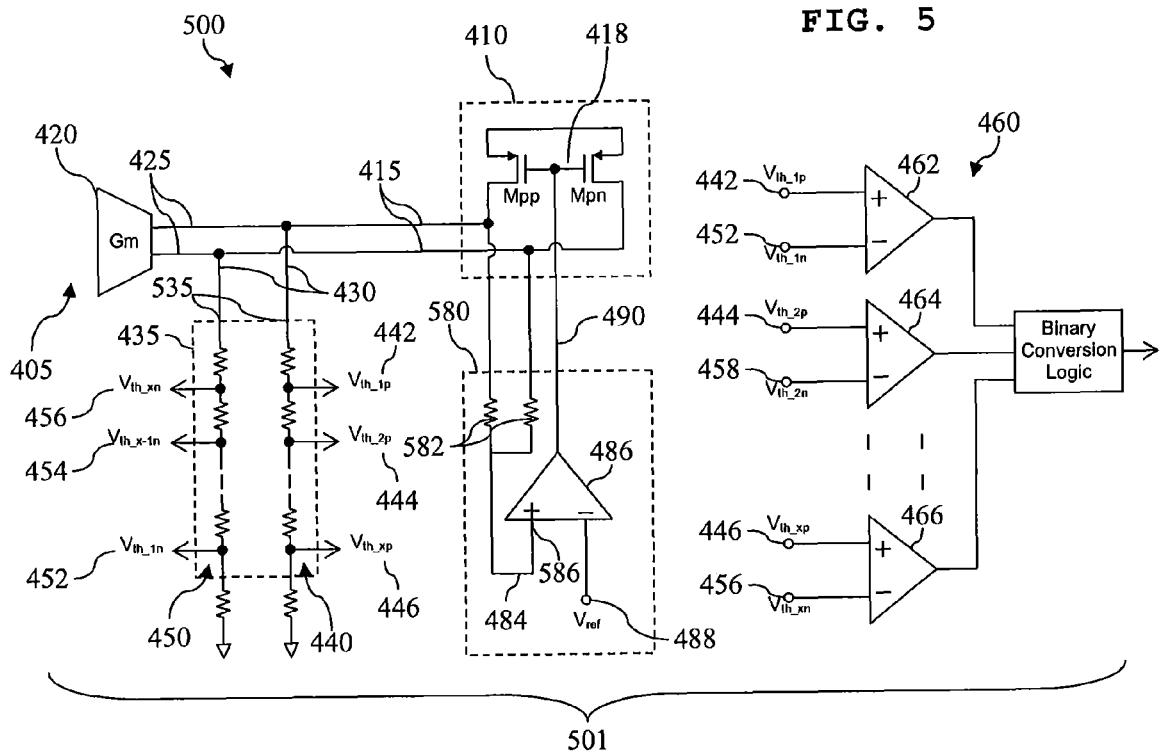
FIG. 5 illustrates an alternative example of threshold generation.

Referring now to FIG. 5, there is illustrated an alternative example of threshold generation circuitry 500. In the same manner as for the example illustrated in FIG. 4, the threshold generation circuitry 500 illustrated in FIG. 5 forms a part of flash ADC 501. For clarity, reference numerals have been reused for those elements common to both FIG's 4 and 5.

The threshold generation circuitry 500 comprises common mode current generation circuitry 410 arranged to generate a common mode current signal 415 comprising a common mode component. The common mode current signal 415 is combined with an input current signal 425 to produce a combined current signal 430. For the illustrated example, the input current signal 425 is provided by transconductance circuitry 420 that is arranged to receive as an input a differential input voltage signal 405 and to convert the differential input voltage signal 405 into the input current signal 425.

The threshold generation circuitry 500 further comprises conversion circuitry 435 arranged to receive the combined current signal 430 and to convert the combined current signal into the at least one differential voltage signal for use within a comparator circuit. For the illustrated example, the conversion circuitry 435 comprises a differential voltage ladder structure comprising a pair of resistor strings 440, 450 arranged to convert the received combined current signal 430 into voltage signals 442, 444, 446, 452, 454, 456 that may be used to provide one or more differential voltage signals for use within a comparator circuit, such as comparator circuit 460.

For the illustrated example, the comparator circuit 460 comprises comparators 462, 464, 466, each arranged to receive a differential voltage signal provided by the conversion circuitry 435. More specifically for the illustrated example, each voltage signal generated by the first resistor string 440 is paired with the inverse equivalent voltage signal generated by the second resistor string 450 (for example as may be graphically represented as being diagonally opposing) to generate a differential voltage signal for comparison by a comparator 462, 464, 466. Each of the comparators 462, 464, 466 is arranged to perform a comparison of the differential voltage signals received thereby, and to output an indication of the result of the comparison, as is known in the art. The outputs of the comparators 462, 464, 466 are provided to binary conversion logic 470, which receives the indications output by the comparators 462, 464, 466, which, in turn, outputs a binary value based on the received indications.

The threshold generation circuitry 500 further comprises feedback circuitry 580 arranged to receive an indication of the common mode component of the combined current signal 430, compare the received indication to a reference value, and to regulate the common mode current signal 415 generated by the common current generation circuitry 410 based at least partly on the comparison of the received indication of the combined signal common mode component to the reference value. The feedback circuitry 580 comprises amplifier 486, which is arranged to receive an indication of the common mode component of the combined current signal 430 in the form of a voltage signal 484, and to compare the received voltage signal 484 to a reference voltage 488, and to output a result of the comparison in the form of a common mode current regulation signal 490. This common mode current regulation signal 490 may then be provided to, for example, a common gate terminal node 418 of the current generation circuitry 410.

For the example illustrated in FIG. 5, the voltage signal 484, provided to the comparator 486 of the feedback circuitry 580 as an indication of the common mode component of the combined current signal 430, is provided by way of an input 586 of the amplifier 486. Amplifier 486 is operably coupled to input nodes 535 of the conversion circuit 435 where the combined current signal 430 is provided to the conversion circuit 435 via resistors 582. In this manner, an indication of the voltage across the conversion circuit 435 is provided to the amplifier 486, which is representative of the current flowing there through. In the same manner as for the example illustrated in FIG. 4, any differential component of the voltage across the conversion circuit 435 resulting from the differential component within the differential combined current signal 430 effectively sums to zero at the input 586 of amplifier 486. Thus, only the common mode component of the voltage across the conversion circuit 435 is present at the input 586 of the comparator 486.

Figure 6:
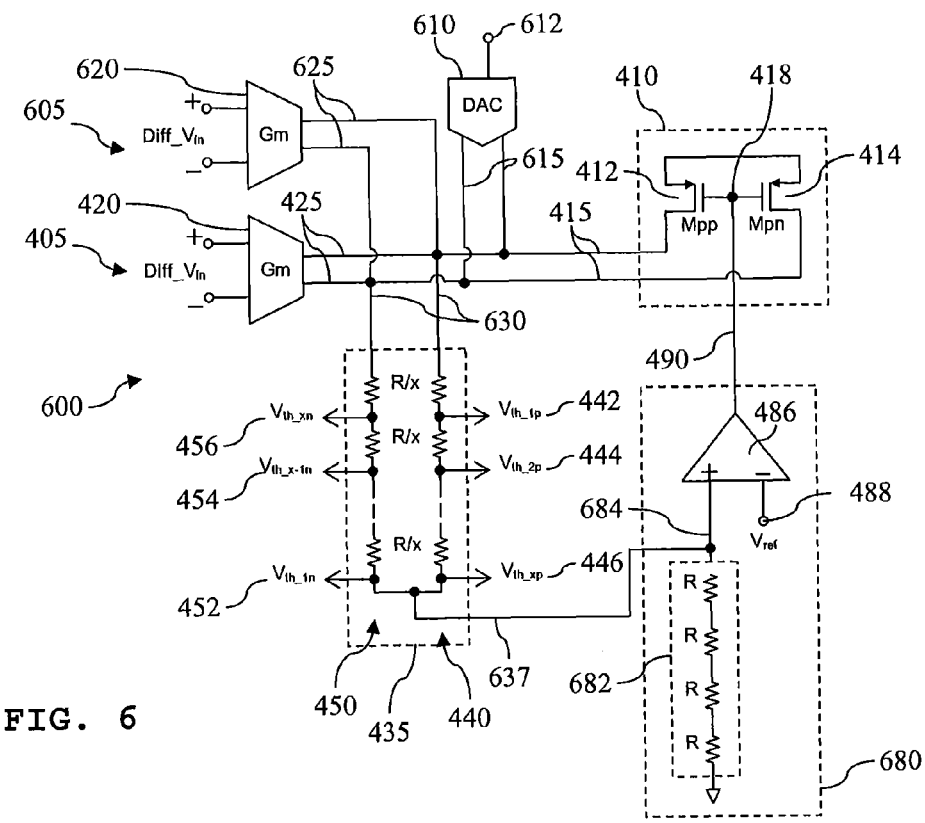
FIG. 6 illustrates a further alternative example of threshold generation.

Referring now to FIG. 6, there is illustrated a further alternative example of threshold generation circuitry 600. Once again for clarity, reference numerals have been reused for those elements common to both FIG's 4 and 6.

The threshold generation circuitry 600 comprises common mode current generation circuitry 410 arranged to generate a common mode current signal 415 comprising a common mode component. The common mode current signal 415 is combined with a first input current signal 425 provided by transconductance circuitry 420, which is arranged to receive as an input a differential input voltage signal 405 and to convert the differential input voltage signal 405 into the input current signal 425. For the example illustrated in FIG. 6, the common mode current signal 415 and the first input current signal 425 are further combined with a second input current signal 625 provided by transconductance circuitry 620, which is arranged to receive as an input a differential input voltage signal 605 and to convert the differential input voltage signal 605 into the second input current signal 625. Furthermore for the illustrated example, the common mode current signal 415 and the input current signals 425, 625 are also combined with a third input current signal 615 provided by digital to analogue converter (DAC) circuitry 610, which is arranged to receive as an input a digital input signal 612 and to convert the digital input signal 612 into the third input current signal 615. For example, the digital input signal 612 may comprise a part of a feedback path (not shown) from a digital output of, say, an analogue to digital converter, of which the threshold generation circuitry 600 forms a part, back to the analogue domain. In this manner, the digital feedback may allow for selective spectral suppression of digital quantization noise. A requirement for such suppression of quantization noise is oversampling. Thus, for the example illustrated in FIG. 6, a combined current signal 630 is produced by the combination of the common mode current signal 415, and the input current signals 425, 625, 615.

It is contemplated that any number of input current signals may be combined with the common mode current signal 415 in order to produce the combined current signal 630. Furthermore, it is contemplated that the threshold generation circuitry 600 may comprise more than one common mode current generation circuit, such that more than one common mode current signal may be generated and combined along with the one or more input current signals to produce the combined current signal 630.

The threshold generation circuitry 600 further comprises conversion circuitry 435 arranged to receive the combined current signal 630 and to convert the combined current signal 630 into the at least one differential voltage signal for use within a comparator circuit. For the illustrated example, the conversion circuitry 435 comprises a differential voltage ladder structure comprising a pair of resistor strings 440, 450 arranged to convert the received combined current signal 630 into voltage signals 442, 444, 446, 452, 454, 456, that may be used to provide one or more differential voltage signals for use within a comparator circuit, such as comparator circuit 460 in FIG. 4.

The threshold generation circuitry 600 further comprises feedback circuitry 680 arranged to receive an indication of the common mode component of the combined current signal 630, compare the received indication to a reference value, and to regulate the common mode current signal 415 generated by the common current generation circuitry 410 based at least partly on the comparison of the received indication of the combined signal common mode component to the reference value. More specifically for the illustrated example, the resistor strings 440, 450 are operably coupled to ground via a common resistance in the form of a resistor string 682 such that the combined current signal 630 flows through the resistor strings 440, 450, before being merged into a combined common mode current signal 637. The resulting combined common mode current signal 637 then flows through the common resistor string 682 to ground, such that a potential difference is created across the common resistor string 682 that is substantially proportional to the common mode component of the combined current signal 630. This potential difference across the common resistor string 682 creates a voltage signal 684 that is provided to an amplifier 486 as an indication of the common mode component of the combined current signal 630. A reference voltage 488 is also provided to the amplifier 486, which compares the voltage signal 684 to the reference voltage 488 and outputs a result of the comparison in the form of a common mode current regulation signal 490. This common mode current regulation signal 490 is then provided to the common gate terminal node 418 of the common mode current generation circuitry 410.

For the example illustrated in FIG. 6, the resistor string 682 within the feedback circuitry 680 comprises n resistors of value R, and each of the resistor strings 440, 450 comprises x resistors of value R/x. In this manner, the threshold generation circuitry provides a threshold step within the differential voltage signals provided to, say, the comparators 462, 464, 466 in comparator circuitry 460 (FIG. 4) equal to:

$$\frac{REF}{nR} \times \frac{1}{2} \times \frac{2 \times R}{x} = \frac{REF}{nx}, \qquad [1]$$

where: REF is the reference voltage value. Thus, in a case where the resistor string 682 comprises four resistors of value R, and each of the resistors strings 440, 450 comprises seven resistors of value R/7, the threshold step equals:

$$\frac{REF}{4R} \times \frac{1}{2} \times \frac{2 \times R}{7} = \frac{REF}{28}, \qquad [2]$$

As can be seen, for this implementation the threshold voltage is only related to the ratio of resistors, and can therefore be accurate even if the resistor values vary due to process and temperature variations.

Figure 7:
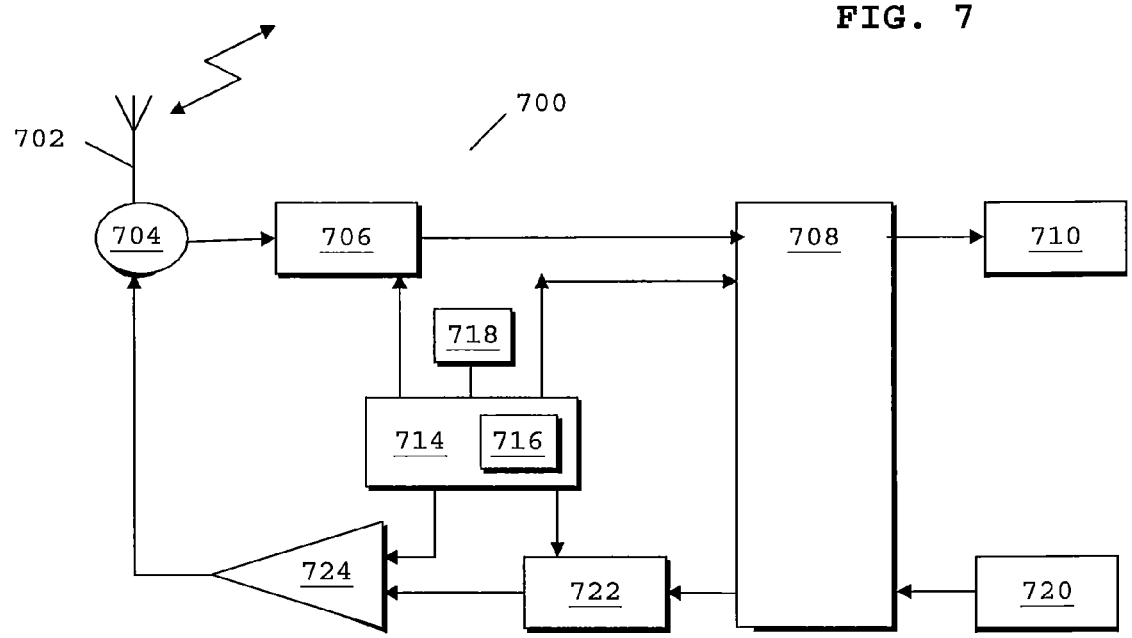
FIG. 7 illustrates a block diagram of an example of an electronic device capable of using an example of a threshold generation circuit.

Referring first to FIG. 7, there is illustrated a block diagram of an example of an electronic device capable of being adapted to use one of the threshold generation circuit examples. For the illustrated example, the electronic device comprises a wireless communication unit 700 (sometimes referred to as a mobile subscriber unit (MS) in the context of cellular communications or a user equipment (UE) in terms of a $3^{rd}$ generation partnership project (3GPP) communication system). The wireless communication unit 700 contains an antenna 702 preferably coupled to a duplex filter or antenna switch 704 that provides isolation between receive and transmit chains within the MS 700.

The receiver chain, as known in the art, includes receiver front-end circuitry 706 (effectively providing reception, filtering and intermediate or base-band frequency conversion). The front-end circuitry 706 is serially coupled to a signal processing module 708. An output from the signal processing module 708 is provided to a suitable output device 710, such as a screen or flat panel display. A controller 714 maintains overall subscriber unit control, and is coupled to the receiver front-end circuitry 706 and the signal processing module 708 (generally realised by a digital signal processor (DSP)). The controller 714 is also coupled to a memory device 716 that selectively stores operating regimes, such as decoding/encoding functions, synchronisation patterns and the like.

As regards the transmit chain, this essentially includes an input device 720, such as a keypad, coupled in series through transmitter/modulation circuitry 722 and a power amplifier 724 to the antenna 702. The signal processor module 708 in the transmit chain may be implemented as distinct from the processor in the receive chain. Alternatively, a single processor module 708 may be used to implement processing of both transmit and receive signals, as shown in FIG. 7. Clearly, the various components within the MS 700 can be realised in discrete or integrated component form, with an ultimate structure therefore being merely an application-specific or design selection.

In accordance with examples of the invention, the MS 700 may comprise one or more threshold generation circuits, such as comprising the threshold generation circuitry illustrated in any one of FIGS. 4 to 6 and hereinbefore described. For example, the receiver front-end circuitry 706 of the MS 700 may typically comprise radio frequency amplification, filtering and baseband conversion circuitry to convert RF signals to analogue baseband signals. Thereafter baseband processing circuits, such as signal processing module 708 may comprise one or more analogue to digital circuits comprising such threshold generation circuits for converting received analogue signals into digital (baseband) signals etc.

A skilled artisan will appreciate that whilst an electronic device in the form of a wireless communication unit has been described, alternative applications and forms of electronic devices may equally comprise analogue to digital converters and the like in which threshold generation circuitry adapted in accordance with the present invention could be implemented.

Figure 8:
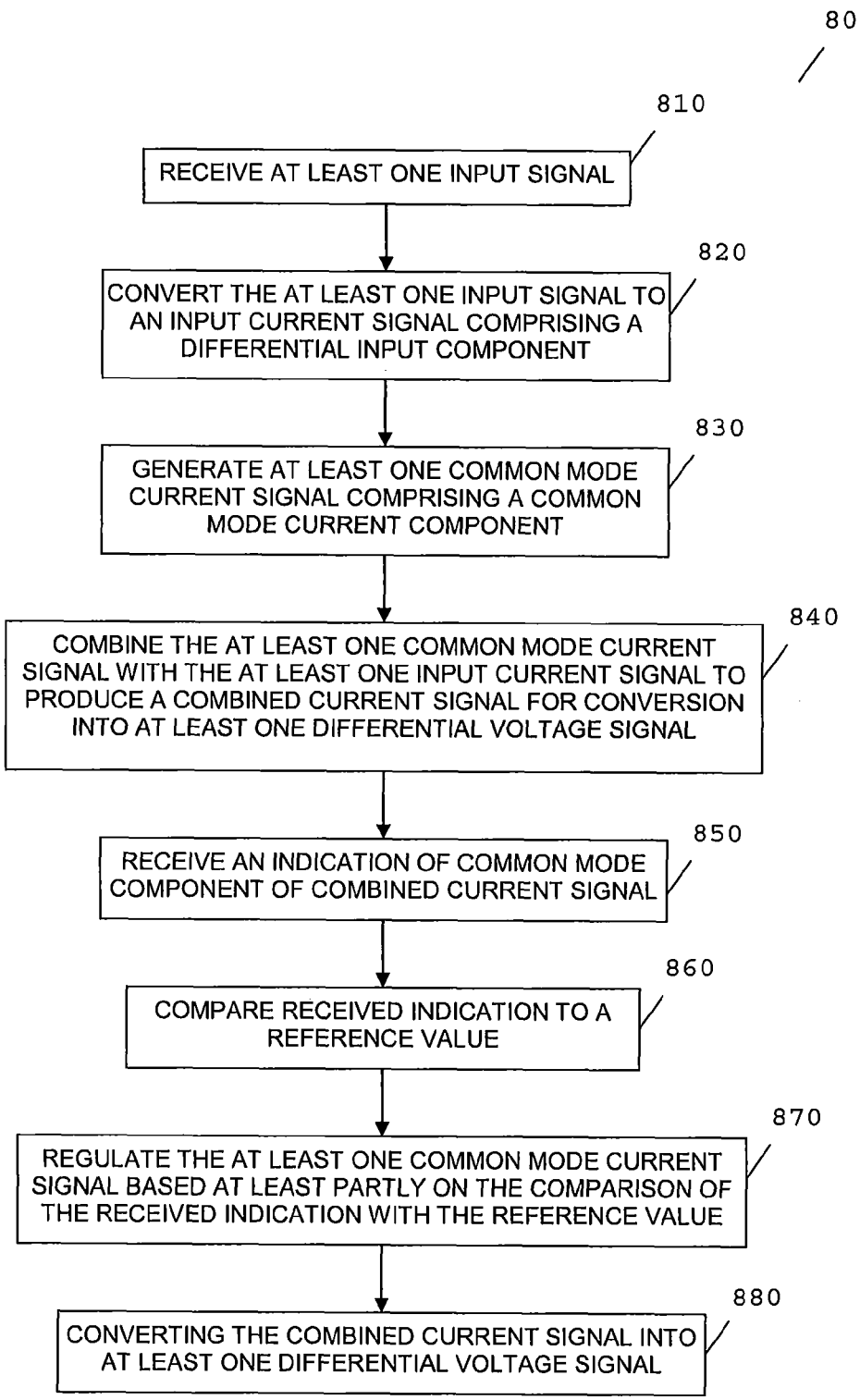
FIG. 8 illustrates a simplified flowchart of an example of a method for generating at least one differential voltage signal.

Referring now to FIG. 8, a simplified flowchart 800 illustrates an example of a method for generating at least one differential voltage signal for use within a comparator circuit, the at least one differential voltage signal comprising a differential signal component and a threshold signal component.

The method starts at step 810 with a receipt of at least one input signal. For example, such an input signal may comprise an analogue signal such as a differential input voltage signal. Alternatively such an input signal may comprise a digital input signal. Next, at step 820, the at least one received input signal is converted to an input current signal comprising a differential input component. For example, in a case of an analogue signal, such as a differential input voltage signal, the input signal may be converted to an input current signal by transconductance circuitry. Alternatively, in a case of a digital input signal, the input signal may be converted into an input current signal by a digital to analogue converter. At least one common mode current signal comprising a common mode current component is then generated at step 830, and then combined with the at least one input current signal at step 840 to produce a combined current signal to be converted into at least one differential voltage signal, for example by way of a voltage ladder structure comprising a pair of resistor strings. An indication of a common mode component of the combined current signal is then received at step 850 and compared to a reference value in step 860. Next, at step 870, the at least one common mode current signal is regulated based at least partly on the comparison of the received indication with the reference value, and the combined current signal is converted into the at least one differential voltage signal at step 880.

Advantageously, at least some embodiments of the present invention provide for comparator thresholds that are stable against changes in supply voltage, bias current and temperature. The thresholds are also stable in the presence of any process variation that affects the circuit elements. The thresholds are also stable against process mismatches in transconductance circuitry or digital to analogue converter circuitry used to convert input signals to current signals, which result in these circuits producing a common mode output current.

It is envisaged that the aforementioned inventive concept can be applied by a semiconductor manufacturer to any integrated circuit comprising threshold generation circuitry. It is further envisaged that, for example, a semiconductor manufacturer may employ the inventive concept in a design of a stand-alone device, such as a flash analogue to digital converter, or application-specific integrated circuit (ASIC) and/ or any other sub-system element. It is envisaged that the inventive concept herein described are particularly, but not exclusively, applicable to analogue to digital converters, and more particularly to stand alone flash converters or flash converters embedded within larger applications such as, by way of example only, Sigma Delta, pipeline and cyclic analogue to digital converters.

It will be appreciated that, for clarity purposes, the above description has described embodiments of the invention with reference to different functional units and circuitry. However, it will be apparent that any suitable distribution of functionality between different functional units or circuitry, for example with respect to the feedback circuitry or common mode current generation circuitry, may be used without detracting from the invention. For example, functionality illustrated to be performed by separate functional units or circuitry may be performed by the same functional unit or circuitry. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or circuit. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved integrated circuit comprising threshold generation circuitry, an electronic device comprising threshold generation circuitry and a method of operation therefor have been described, wherein the aforementioned disadvantages with prior art arrangements have been substantially alleviated.

The invention claimed is:

1. An integrated circuit comprising threshold generation circuitry for generating at least one differential voltage signal for use within a comparator circuit, the threshold generation circuitry comprising:
   at least one common mode current generation circuit arranged to generate at least one common mode current signal comprising a common mode component, whereby said at least one common mode current signal is combined with at least one input current signal comprising a differential input component to produce a combined current signal comprising a combined signal common mode component and a combined signal differential component; and
   conversion circuitry arranged to receive the combined current signal and to convert the combined current signal into the at least one differential voltage signal for use within the comparator circuit;
   wherein the threshold generation circuitry further comprises feedback circuitry arranged to:
   receive an indication of the combined signal common mode component;
   compare the received indication of the combined signal common mode component to a reference value; and
   regulate the at least one common mode current signal generated by the at least one common mode current generation circuit based at least partly on the comparison of the received indication of the combined signal common mode component to the reference value.

2. The integrated circuit of claim 1 wherein the combined current signal comprises a pair of differential signals each comprising a differential component corresponding to the differential input component of at least the input current signal and a common mode component corresponding to the common mode component of at least the common mode current signal, and the indication of the combined signal common mode component is provided by merging the differential signals into a single common mode combined current signal.

3. The integrated circuit of claim 2 wherein the single common mode combined current signal is arranged to flow through a common resistance to create a voltage signal to provide the indication of the combined signal common mode component.

4. The integrated circuit of claim 3 wherein the feedback circuitry comprises an amplifier, and the voltage signal created by the single common mode combined current signal flowing through the common resistance is provided to the amplifier as the indication of the common mode component of the combined current signal.

5. The integrated circuit of claim 4 wherein the amplifier is further arranged to receive a reference voltage corresponding to the reference value, and to compare the voltage signal created by the single common mode combined current signal flowing through the common resistance to the reference voltage, and to output a result of the comparison in a form of a common mode current regulation signal.

6. The integrated circuit of claim 4 wherein:
   the common resistance comprises a resistor string comprising n resistors of value R; and
   the conversion circuitry comprises a differential voltage ladder structure comprising a pair of resistor strings arranged to convert the received combined current signal into voltage signals for providing the at least one differential voltage signal for use within a comparator circuit.

7. The integrated circuit of claim 6 wherein each resistor string of the ladder structure comprises x resistors of value R/x; and the threshold generation circuitry is arranged to provide a threshold step within the at least one differential voltage signal for use within a comparator circuit equal to:

$$\frac{REF}{nR} \times \frac{1}{2} \times \frac{2 \times R}{x} = \frac{REF}{nx}.$$

8. The integrated circuit of claim 1 wherein the feedback circuitry comprises an amplifier arranged to receive the indication of the combined signal common mode component in a form of a voltage signal, and to compare the received voltage signal to a reference voltage corresponding to the reference value.

9. The integrated circuit of claim 8 wherein the indication of the combined signal common mode component is received in a form of a voltage signal provided by way of an input of the amplifier being operably coupled to at least one input node of the conversion circuitry.

10. The integrated circuit of claim 9 wherein the combined current signal is provided to the conversion circuitry via at least one resistor.

11. The integrated circuit of claim 1 wherein the common mode current generation circuit comprises a pair of transistors arranged to provide the common mode current signal from drain terminals thereof.

12. The integrated circuit of claim 11, wherein at least two gate terminals of the transistors of the common mode current generation circuit are operably coupled together to provide a common gate terminal node via which the common mode current signal provided by the transistors is regulated.

13. The integrated circuit of claim 1 wherein the threshold generation circuitry further comprises at least one transconductance circuit arranged to receive as an input a differential input voltage signal and to convert the differential input voltage signal into the at least one input current signal.

14. The integrated circuit of claim 1 wherein the threshold generation circuitry further comprises at least one digital to analogue converter circuit arranged to receive as an input a digital input signal and to convert the digital input signal into the at least one input current signal.

15. The integrated circuit of claim 1 wherein the conversion circuitry comprises a differential voltage ladder structure comprising a pair of resistor strings arranged to convert the received combined current signal into a plurality of voltage signals for providing the at least one differential voltage signal for use within a comparator circuit.

16. The integrated circuit of claim 15 wherein a voltage signal generated by a first resistor string is paired with an inverse equivalent voltage signal generated by a second resistor string to generate a differential voltage signal for use within a comparator circuit.

17. The integrated circuit of claim 1 wherein the threshold generation circuitry is arranged to generate at least one differential voltage signal for use within comparator circuitry of a flash analogue to digital converter.

18. The integrated circuit device of claim 1 wherein the threshold generation circuitry forms part of an analogue to digital converter.

19. An electronic device comprising threshold generation circuitry for generating at least one differential voltage signal for use within a comparator circuit, the threshold generation circuitry comprising:

common mode current generation circuit arranged to generate a common mode current signal, whereby said common mode current signal is combined with at least one input current signal to produce a combined current signal comprising a combined signal common mode component; and conversion circuitry arranged to receive the combined current signal and to convert the combined current signal into the at least one differential voltage signal for use within the comparator circuit;

wherein the threshold generation circuitry further comprises feedback circuitry arranged to:

receive an indication of the combined signal common mode component;

compare the received indication of the combined signal common mode component to a reference value; and regulate the common mode current signal generated by the common mode current generation circuit based at least partly on the comparison of the received indication of the combined signal common mode component to the reference value.

20. A method for generating at least one differential voltage signal for use within a comparator circuit, the method comprising:

combining at least one common mode current signal with at least one input current signal to produce a combined current signal comprising a combined signal common mode component;

converting the combined current signal into the at least one differential voltage signal for use within the comparator circuit;

comparing an indication of the combined signal common mode component to a reference value; and regulating the at least one common mode current signal based at least partly on the comparison of the indication of the combined signal common mode component to the reference value.

* * * * *